United States Patent
Sun

(10) Patent No.: US 11,217,774 B1
(45) Date of Patent: Jan. 4, 2022

(54) ORGANIC LIGHT EMITTING DIODE DISPLAY PANEL AND MANUFACTURING METHOD THEREOF

(71) Applicant: WUHAN CHINA STAR OPTOELECTRONICS SEMICONDUCTOR DISPLAY TECHNOLOGY CO., LTD., Hubei (CN)

(72) Inventor: Jiajia Sun, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 205 days.

(21) Appl. No.: 16/642,180

(22) PCT Filed: Nov. 18, 2019

(86) PCT No.: PCT/CN2019/119289
§ 371 (c)(1),
(2) Date: Feb. 26, 2020

(87) PCT Pub. No.: WO2021/036015
PCT Pub. Date: Mar. 4, 2021

(30) Foreign Application Priority Data

Aug. 30, 2019 (CN) .......................... 201910811156.0

(51) Int. Cl.
*H01L 51/52* (2006.01)
*H01L 27/32* (2006.01)
*H01L 51/56* (2006.01)

(52) U.S. Cl.
CPC .......... *H01L 51/5259* (2013.01); *H01L 51/56* (2013.01); *H01L 27/3244* (2013.01); *H01L 51/5253* (2013.01)

(58) Field of Classification Search
CPC . H01L 51/5259; H01L 51/56; H01L 27/3244; H01L 51/5253; H01L 27/3248
USPC ........................... 257/40, 72; 438/48, 82, 99
See application file for complete search history.

(56) References Cited

U.S. PATENT DOCUMENTS

| | | | |
|---|---|---|---|
| 2016/0276246 | A1 | 9/2016 | Yamaguchi et al. |
| 2017/0271623 | A1* | 9/2017 | Wang et al. ........ H01L 51/5268 |
| 2019/0252641 | A1 | 8/2019 | Zhang et al. |

FOREIGN PATENT DOCUMENTS

| | | |
|---|---|---|
| CN | 101009362 A | 8/2007 |
| CN | 205881935 U | 1/2017 |
| CN | 107394059 A | 11/2017 |
| CN | 109004104 A | 12/2018 |
| CN | 109904341 A | 6/2019 |

* cited by examiner

*Primary Examiner* — Thinh T Nguyen

(57) ABSTRACT

An organic light emitting diode display panel includes a substrate; an array layer disposed on the substrate; a groove defined on a surface of the array layer away from the substrate; a phase change composite material containing dry particles disposed in the groove; an electroluminescent layer disposed on the array layer; and a thin film encapsulation layer disposed on the electroluminescent layer and extending onto the array layer to cover the groove.

19 Claims, 3 Drawing Sheets

ORGANIC LIGHT EMITTING DIODE DISPLAY PANEL AND MANUFACTURING METHOD THEREOF

FIELD OF INVENTION

The present disclosure relates to the field of display technologies, and more particularly to an organic light emitting diode display panel and a manufacturing method thereof.

BACKGROUND OF INVENTION

At present, organic light emitting diode devices have advantages such as light weight, wide viewing angles, fast response time, low temperature resistance, and high luminous efficiency compared to traditional liquid crystal displays. Therefore, they have been regarded as a next-generation new display technology in the display industry.

In recent years, invasion of moisture from an outside into the organic light emitting diode devices will seriously affect luminous efficiency and service life of the devices. In a thin film encapsulation layer, inorganic/organic/inorganic alternately laminated film structure is often used. An inorganic film layer serves as a barrier layer for water and oxygen, and an organic film layer serves as a buffer layer. A double inorganic film layer of the thin film encapsulation layer and part of the inorganic film layer in an array layer are not formed at one time, so the inorganic film layers cannot achieve close contact at the interface thereof. This leads to possibility that external water vapor will invade from around, which will affect luminous efficiency and service life of the device.

Therefore, how to effectively prevent water vapor from invading a side of the organic light emitting diode device is a difficult issue that panel manufacturers worldwide are trying to overcome.

SUMMARY OF INVENTION

The present application provides an organic light emitting diode display panel and a manufacturing method thereof, which can solve a technical problem of how to effectively prevent water vapor from invading a side of an organic light emitting diode device.

An embodiment of the present application provides an organic light emitting diode display panel, comprising: a substrate; an array layer disposed on the substrate and comprising a display area and a non-display area defined around the display area; a groove defined on a surface of the array layer away from the substrate and on the non-display area; a phase change composite material containing dry particles disposed in the groove, and a particle size of each of the dry particles ranging between 5 nm and 50 nm; an electroluminescent layer disposed on the array layer; and a thin film encapsulation layer disposed on the electroluminescent layer and extending onto the array layer to cover the groove.

In an embodiment of the present application, the array layer comprises an array sub-layer and a first inorganic film layer sequentially stacked on the substrate, and the groove is defined on a surface of the first inorganic film layer away from the substrate; and the thin film encapsulation layer comprises a second inorganic film layer, an organic layer, and a third inorganic film layer sequentially stacked on the electroluminescent layer, and the third inorganic film layer extends to the surface of the array layer away from the substrate and covers the groove.

In an embodiment of the present application, the groove is ring-shaped, and the groove is defined around the display area.

In an embodiment of the present application, the groove is a square ring groove or a circular groove.

In an embodiment of the present application, a number of the groove is at least one.

In an embodiment of the present application, when the number of the grooves is plural, and there is a preset distance between adjacent grooves.

In an embodiment of the present application, the phase change composite material comprises a combination of one or more of paraffin, fatty acids, and high-density polyethylene.

In an embodiment of the present application, each of the dry particles comprises a combination of one or more of calcium oxide, magnesium oxide, and silicate.

An embodiment of the present application provides an organic light emitting diode display panel, comprising: a substrate; an array layer disposed on the substrate; a groove defined on a surface of the array layer away from the substrate; a phase change composite material containing dry particles disposed in the groove; an electroluminescent layer disposed on the array layer; and a thin film encapsulation layer disposed on the electroluminescent layer and extending onto the array layer to cover the groove.

In an embodiment of the present application, the array layer comprises an array sub-layer and a first inorganic film layer sequentially stacked on the substrate, and the groove is defined on a surface of the first inorganic film layer away from the substrate; and the thin film encapsulation layer comprises a second inorganic film layer, an organic layer, and a third inorganic film layer sequentially stacked on the electroluminescent layer, and the third inorganic film layer extends to the surface of the array layer away from the substrate and covers the groove.

In an embodiment of the present application, the array layer comprises a display area and a non-display area defined around the display area, and the groove is defined on the non-display area.

In an embodiment of the present application, the groove is ring-shaped, and the groove is defined around the display area.

In an embodiment of the present application, the groove is a square ring groove or a circular groove.

In an embodiment of the present application, a number of the groove is at least one.

In an embodiment of the present application, when the number of the grooves is plural, and there is a preset distance between adjacent grooves.

In an embodiment of the present application, the phase change composite material comprises a combination of one or more of paraffin, fatty acids, and high-density polyethylene.

In an embodiment of the present application, a particle size of each of the dry particles ranges between 5 nm and 50 nm.

In an embodiment of the present application, each of the dry particles comprises a combination of one or more of calcium oxide, magnesium oxide, and silicate.

An embodiment of the present application provides a method of manufacturing an organic light emitting diode display panel, comprising: providing a substrate on which an array layer is formed; forming a groove on a surface of the array layer away from the substrate; adding a phase change composite material containing dry particles in the groove; curing the phase change composite material containing the dry particles; and sequentially forming an electroluminescent layer and a thin film encapsulation layer on the array layer, and the thin film encapsulation layer extending onto the array layer to cover the groove.

Beneficial Effect

In the organic light emitting diode display panel and the manufacturing method thereof provided by the present application, grooves with different shapes are designed at edges of a boundary between the array layer and the thin film encapsulation layer. The phase change composite material containing nano-dry particles is added in the groove. Nano-dry particles are used to capture moisture invading from outside. The phase change composite material is used to fix a large amount of heat released by the nano-dry particles and to slowly release the nano-dry particles after absorbing water for a short period of time, thereby effectively preventing external moisture from invading a side of the organic light emitting diode display panel, thereby improving flexible packaging ability of the thin film encapsulation layer.

DESCRIPTION OF DRAWINGS

In order to explain the technical solution in the present application more clearly, the accompanying drawings used in the description of the embodiments will be briefly introduced below. Obviously, the drawings in the following description are only some embodiments of the present application. For those skilled in the art, other drawings can be obtained based on these drawings without paying creative efforts.

DETAILED DESCRIPTION OF PREFERRED EMBODIMENTS

Figure 1:
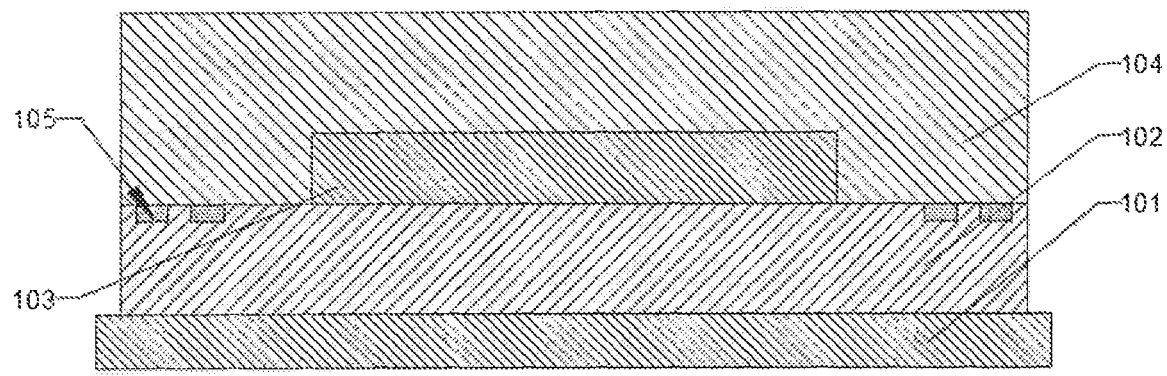
FIG. 1 is a schematic structural diagram of an organic light emitting diode display panel according to an embodiment of the present application.

Referring to FIG. 1, FIG. 1 is a schematic structural diagram of an organic light emitting diode display panel according to an embodiment of the present application. As illustrated in FIG. 1, the organic light emitting diode display panel provided in an embodiment of the present application includes a substrate 101, an array layer 102 disposed on the substrate 101, an electroluminescent layer 103 disposed on the array layer 102, and a thin film encapsulation layer 104 disposed on the electroluminescent layer and covering the electroluminescent layer 103. A groove 105 is provided on a surface of the array layer 102 away from the substrate. A phase change composite material containing dry particles is provided in the groove 105. The thin film encapsulation layer 104 extends onto the array layer 102 to cover the groove 105.

Understandably, when external water vapor invades from a side of the organic light emitting diode display panel, the dry particles disposed in the groove 105 will absorb the invading water vapor and prevent further invasion of the water vapor. Water vapor reduces luminous efficiency and service life of electroluminescent materials. The embodiment of the present application achieves isolation of water vapor from invading from the side of the organic light emitting diode display panel to the display area of the organic light emitting diode display panel. This reduces influence of water vapor on performance of organic packaging material and improves flexible packaging capability of the thin film encapsulation layer 104.

Understandably, when the dry particles absorb moisture invaded from the outside, they will release a large amount of heat sharply. The effect of thermal expansion and contraction will cause peeling between the thin film encapsulation layer 104 and the film layer of the array layer 102, thereby affecting the flexible packaging ability of the thin film encapsulation layer 104. The phase change composite material can absorb a large amount of heat in a short time, causing phase transitions of the phase change composite material. For example, a solid phase change composite material is converted into a liquid phase change composite material, and then, after the phase change composite material is cooled, the phase change composite material undergoes a reverse phase change. Then the stored heat is slowly released into the environment to play a slow-release role. This prevents peeling between the thin film encapsulation layer 104 and the film layer of the array layer 102, thereby improving the flexible packaging ability of the thin film encapsulation layer 104.

In one embodiment, the phase change composite material includes a combination of one or more of paraffin, fatty acids, and high-density polyethylene.

In one embodiment, each of the dry particles includes a combination of one or more of calcium oxide, magnesium oxide, and silicate.

In one embodiment, a particle size of each of the dry particles ranges between 5 nm and 50 nm.

Figure 2:
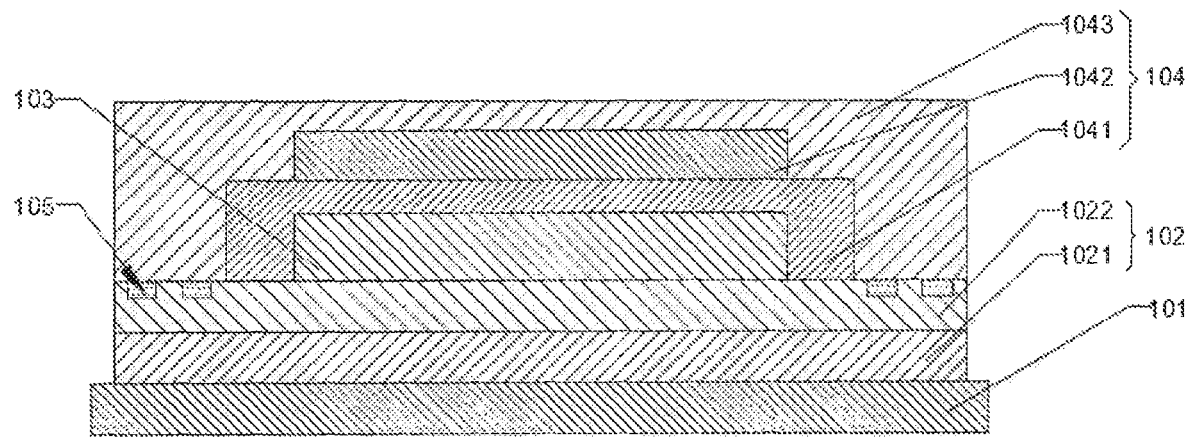
FIG. 2 is another schematic structural diagram of an organic light emitting diode display panel according to an embodiment of the present application.

Further, referring to FIG. 2, FIG. 2 is another schematic structural diagram of an organic light emitting diode display panel according to an embodiment of the present application. The difference between the organic light emitting diode display panel shown in FIG. 2 and the organic light emitting diode display panel shown in FIG. 1 is that the array layer 102 includes an array sub-layer 1021 and a first inorganic film layer 1022 that are sequentially stacked on the substrate 101. The groove 105 is disposed on a surface of the first inorganic film layer 1022 away from the substrate 101. The thin film encapsulation layer 104 includes a second inorganic film layer 1041, an organic layer 1042, and a third inorganic film layer 1043 that are sequentially stacked on the electroluminescent layer 103. The third inorganic film layer 1043 extends to a surface of the array layer 102 away from the substrate 101 and covers the groove 105.

It can be understood that the groove 105 is provided on the surface of the first inorganic film layer 1022 of the array layer 102, mainly to prevent water vapor from affecting the performance of the organic material. A depth of the groove 105 is smaller than a depth of the first inorganic film layer 1022. If the depth of the groove 105 is greater than the depth of the first inorganic film layer 1022, when the dry particles absorb water vapor invaded from the outside, the water vapor will enter the organic film layer in the array sub-layer 1021 of the array layer, thereby affecting the performance of organic materials.

In one embodiment, the array sub-layer 1021 includes a flexible base layer, a buffer layer, a gate insulating layer, a gate layer, and a source-drain layer that are sequentially stacked on the substrate 101.

Figure 3:
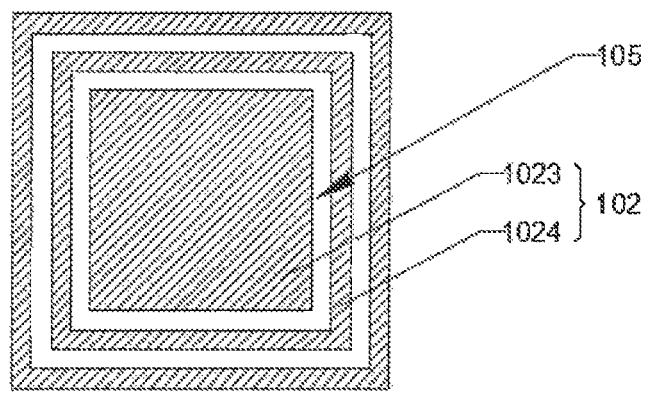
FIG. 3 is a schematic plan view of an organic light emitting diode display panel array layer according to an embodiment of the present application.

Referring to FIG. 3, FIG. 3 is a schematic plan view of an organic light emitting diode display panel array layer according to an embodiment of the present application. The array layer 102 includes a display area 1023 and a non-display area 1024 defined around the display area 1023. The grooves 105 are all defined on the non-display area 1024. The groove 105 is a square annular groove. The number of the grooves 105 is at least one. When the number of the grooves 105 is multiple, there is a preset distance between adjacent grooves 105.

It can be understood that the groove 105 is disposed in the non-display area, because if the groove 105 is disposed in the display area, if the dry particles do not absorb moisture in time, the moisture will affect the performance of the electroluminescent material in the display area. The groove 105 is disposed in the non-display area, so that before the water vapor enters the display area, the water vapor is more fully absorbed, and no water vapor can enter the display area, thereby affecting the performance of the electroluminescent material in the display area.

It can be understood that the number of the grooves 105 is at least one because the amount of external invading water vapor that can be captured by the dry particles in each groove 105 is limited. When too much water vapor is invaded at one time, the single groove 105 cannot completely absorb the water vapor before it enters the display area 1023. This affects the performance of the electroluminescent material in the display area 1023, so a plurality of grooves 105 need to be provided in the non-display area 1024.

It can be understood that when multiple grooves 105 are provided, a distance between adjacent grooves 105 is specifically set according to the invasion of water vapor. Because the water vapor that can be trapped in each groove 105 is limited, the distance between two adjacent grooves 105 matches that when the water vapor trapped near the outer groove 105 reaches saturation, the excess water vapor is absorbed by the next adjacent groove 105.

In one embodiment, the groove 105 is a circular ring groove. A planar shape of the groove 105 on the surface of the array layer can be designed according to the needs of a product, which depends on specific conditions.

Figure 4:
FIG. 4 is a first schematic diagram of a cross section of an array layer of an organic light emitting diode display panel according to an embodiment of the present application.
Figure 5:
FIG. 5 is a second schematic diagram of a cross section of an array layer of an organic light emitting diode display panel according to an embodiment of the present application.
Figure 6:
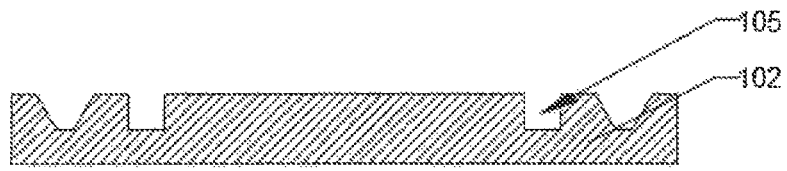
FIG. 6 is a third schematic diagram of a cross section of an array layer of an organic light emitting diode display panel according to an embodiment of the present application.

Referring to FIG. 4, FIG. 5, and FIG. 6, FIG. 4 is a first schematic diagram of a cross section of an array layer of an organic light emitting diode display panel according to an embodiment of the present application, FIG. 5 is a second schematic diagram of a cross section of an array layer of an organic light emitting diode display panel according to an embodiment of the present application, and FIG. 6 is a third schematic diagram of a cross section of an array layer of an organic light emitting diode display panel according to an embodiment of the present application. The difference between FIG. 4, FIG. 5, and FIG. 6 is that the cross-sectional shape of the groove 105 provided on the surface of the array layer 102 away from the substrate 101 is different. The cross-sectional shape of the groove 105 provided on the surface of the array layer 102 on the surface away from the substrate 101 in FIG. 4 is rectangular. The cross-sectional shape of the groove 105 provided on the surface of the array layer 102 away from the substrate 101 in FIG. 5 is an inverted trapezoid. The cross-sectional shape of the groove 105 provided on the surface of the array layer 102 away from the substrate 101 in FIG. 6 is a combination of a rectangular shape and an inverted trapezoid shape.

It can be understood that the cross-sectional shape of the groove 105 provided on the surface of the array layer 102 away from the substrate 101 can be designed according to the needs of the product, depending on the specific situation.

In the organic light emitting diode display panel and the manufacturing method thereof provided by the present application, grooves with different shapes are designed at edges of a boundary between the array layer and the thin film encapsulation layer. The phase change composite material containing nano-dry particles is added in the groove. Nano-dry particles are used to capture moisture invading from outside. The phase change composite material is used to fix a large amount of heat released by the nano-dry particles and to slowly release the nano-dry particles after absorbing water for a short period of time, thereby effectively preventing external moisture from invading a side of the organic light emitting diode display panel, thereby improving flexible packaging ability of the thin film encapsulation layer.

Figure 7:
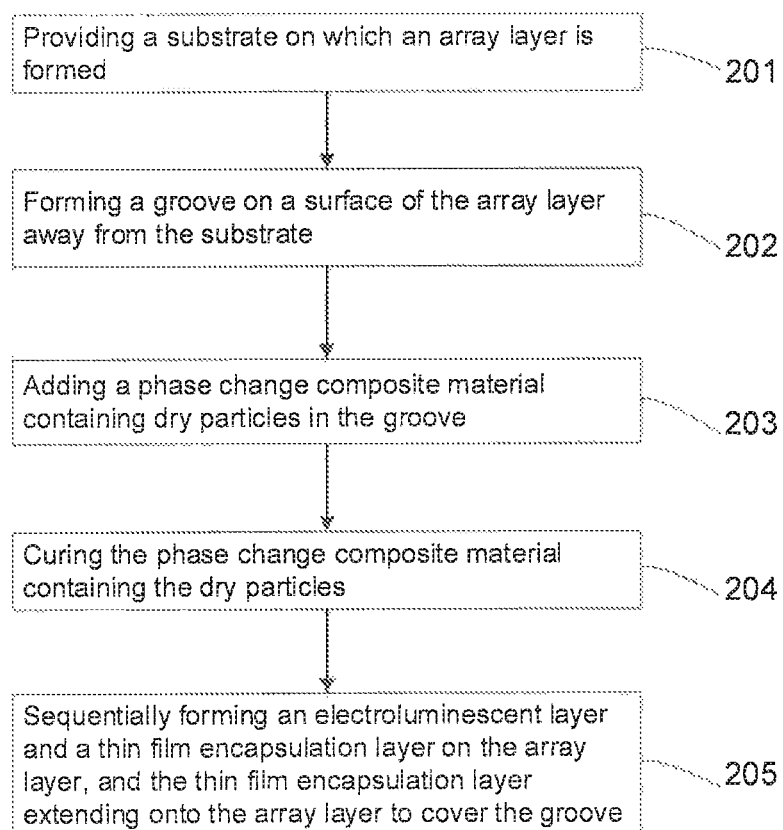
FIG. 7 is a schematic flowchart of a method of manufacturing an organic light emitting diode display panel according to an embodiment of the present application.

Referring to FIG. 7, FIG. 7 is a schematic flowchart of a method of manufacturing an organic light emitting diode display panel according to an embodiment of the present application. As illustrated in FIG. 7, The method includes following steps: Step 201, providing a substrate on which an array layer is formed; Step 202, forming a groove on a surface of the array layer away from the substrate; Step 203, adding a phase change composite material containing dry particles in the groove; Step 204, curing the phase change composite material containing the dry particles; and Step 205, sequentially forming an electroluminescent layer and a thin film encapsulation layer on the array layer, and the thin film encapsulation layer extending onto the array layer to cover the groove.

It can be understood that the grooves can be formed by an etching technology. The etching technology is divided into a dry etching technology and a wet etching technology. A method of adding the phase change composite material containing the dry particles in the groove includes one or more of coating, screen printing, or inkjet printing technology. The solidification of the phase change composite material containing the dry particles is achieved by a technique such as temperature reduction. The phase change composite material change from a solid state to a liquid state when it absorbs heat, and change from a liquid state to a fixed state when it emits heat. To cure the phase change composite material containing dry particles, a temperature in the grooves needs to be reduced. This causes the phase change composite material containing dry particles to radiate heat, and the phase change composite material containing dry particles can be cured.

For the specific structure of the organic light emitting diode display panel provided in the present application, reference may be made to the foregoing embodiments, and details are not described herein again.

It can be understood that, grooves with different shapes are designed at edges of a boundary between the array layer and the thin film encapsulation layer. The phase change composite material containing nano-dry particles is added in the groove. Nano-dry particles are used to capture moisture invading from outside. The phase change composite material is used to fix a large amount of heat released by the nano-dry particles and to slowly release the nano-dry particles after absorbing water for a short period of time, thereby effectively preventing external moisture from invading a side of the organic light emitting diode display panel, thereby improving flexible packaging ability of the thin film encapsulation layer.

The embodiments of the present application are described in detail above. Specific examples are used herein to explain the principles and implementation of the present application. The description of the above embodiments is only used to help understand the present application. In addition, for those skilled in the art, according to the idea of the present application, there will be changes in the specific implementation and application scope. In summary, the content of the specification should not be construed as a limitation on the present application.

What is claimed is:

1. An organic light emitting diode display panel, comprising:
   a substrate;
   an array layer disposed on the substrate and comprising a display area and a non-display area defined around the display area;
   a groove defined on a surface of the array layer away from the substrate and on the non-display area; a phase change composite material containing dry particles disposed in the groove, and a particle size of each of the dry particles ranging between 5 nm and 50 nm;
   an electroluminescent layer disposed on the array layer; and
   a thin film encapsulation layer disposed on the electroluminescent layer and extending onto the array layer to cover the groove.

2. The organic light emitting diode display panel according to claim 1, wherein:
   the array layer comprises an array sub-layer and a first inorganic film layer sequentially stacked on the substrate, and the groove is defined on a surface of the first inorganic film layer away from the substrate; and
   the thin film encapsulation layer comprises a second inorganic film layer, an organic layer, and a third inorganic film layer sequentially stacked on the electroluminescent layer, and the third inorganic film layer extends to the surface of the array layer away from the substrate and covers the groove.

3. The organic light emitting diode display panel according to claim 1, wherein the groove is ring-shaped, and the groove is defined around the display area.

4. The organic light emitting diode display panel according to claim 1, wherein the groove is a square ring groove or a circular groove.

5. The organic light emitting diode display panel according to claim 1, wherein a number of the groove is at least one.

6. The organic light emitting diode display panel according to claim 5, wherein when the number of the grooves is plural, and there is a preset distance between adjacent grooves.

7. The organic light emitting diode display panel according to claim 1, wherein the phase change composite material comprises a combination of one or more of paraffin, fatty acids, and high-density polyethylene.

8. The organic light emitting diode display panel according to claim 1, wherein each of the dry particles comprises a combination of one or more of calcium oxide, magnesium oxide, and silicate.

9. An organic light emitting diode display panel, comprising:
   a substrate;
   an array layer disposed on the substrate; a groove defined on a surface of the array layer away from the substrate;
   a phase change composite material containing dry particles disposed in the groove;
   an electroluminescent layer disposed on the array layer; and
   a thin film encapsulation layer disposed on the electroluminescent layer and extending onto the array layer to cover the groove.

10. The organic light emitting diode display panel according to claim 9, wherein:
    the array layer comprises an array sub-layer and a first inorganic film layer sequentially stacked on the substrate, and the groove is defined on a surface of the first inorganic film layer away from the substrate; and
    the thin film encapsulation layer comprises a second inorganic film layer, an organic layer, and a third inorganic film layer sequentially stacked on the electroluminescent layer, and the third inorganic film layer extends to the surface of the array layer away from the substrate and covers the groove.

11. The organic light emitting diode display panel according to claim 9, wherein the array layer comprises a display area and a non-display area defined around the display area, and the groove is defined on the non-display area.

12. The organic light emitting diode display panel according to claim 11, wherein the groove is ring-shaped, and the groove is defined around the display area.

13. The organic light emitting diode display panel according to claim 11, wherein the groove is a square ring groove or a circular groove.

14. The organic light emitting diode display panel according to claim 11, wherein a number of the groove is at least one.

15. The organic light emitting diode display panel according to claim 14, wherein when the number of the grooves is plural, and there is a preset distance between adjacent grooves.

16. The organic light emitting diode display panel according to claim 9, wherein the phase change composite material comprises a combination of one or more of paraffin, fatty acids, and high-density polyethylene.

17. The organic light emitting diode display panel according to claim 9, wherein a particle size of each of the dry particles ranges between 5 nm and 50 nm.

18. The organic light emitting diode display panel according to claim 9, wherein each of the dry particles comprises a combination of one or more of calcium oxide, magnesium oxide, and silicate.

19. A method of manufacturing an organic light emitting diode display panel, comprising:
    providing a substrate on which an array layer is formed;
    forming a groove on a surface of the array layer away from the substrate;
    adding a phase change composite material containing dry particles in the groove;
    curing the phase change composite material containing the dry particles; and sequentially forming an electroluminescent layer and a thin film encapsulation layer on the array layer, and the thin film encapsulation layer extending onto the array layer to cover the groove.

* * * * *